US010194552B1

(12) United States Patent
Nandyala et al.

(10) Patent No.: US 10,194,552 B1
(45) Date of Patent: Jan. 29, 2019

(54) DIE CAST ENCLOSURE WITH INTEGRAL SPRING CONTACT

(71) Applicant: VISTEON GLOBAL TECHNOLOGIES, INC., Van Buren Township, MI (US)

(72) Inventors: Chakrapani Nandyala, Andhrapradesh (IN); Marcus Walter Koch, Karlsruhe (DE)

(73) Assignee: Visteon Global Technologies, Inc., Van Buren Township, MI (US)

( * ) Notice: Subject to any disclaimer, the term of this patent is extended or adjusted under 35 U.S.C. 154(b) by 0 days.

(21) Appl. No.: 15/873,995

(22) Filed: Jan. 18, 2018

(51) Int. Cl.
| | |
|---|---|
| *H05K 7/02* | (2006.01) |
| *H05K 7/14* | (2006.01) |
| *H05K 5/04* | (2006.01) |
| *B22D 17/00* | (2006.01) |
| *H05K 5/02* | (2006.01) |
| *H01R 13/24* | (2006.01) |
| *H05K 5/00* | (2006.01) |

(52) U.S. Cl.
CPC ........... *H05K 7/1427* (2013.01); *B22D 17/00* (2013.01); *H01R 13/2442* (2013.01); *H05K 5/0069* (2013.01); *H05K 5/0217* (2013.01); *H05K 5/04* (2013.01)

(58) Field of Classification Search
CPC ...... H05K 7/1427; H05K 5/04; H05K 5/0217; H05K 5/0069; B22D 17/00; H01K 13/2442
USPC ........................................................ 174/541
See application file for complete search history.

(56) References Cited

U.S. PATENT DOCUMENTS

| 8,139,364 B2 | 3/2012 | Wickett | |
|---|---|---|---|
| 2005/0068746 A1* | 3/2005 | Weisz-Margulescu | ...................... G01D 11/245 361/728 |
| 2008/0180916 A1* | 7/2008 | Wickett | ............... H05K 5/0039 361/720 |

(Continued)

FOREIGN PATENT DOCUMENTS

EP 0949724 A2 10/1999

OTHER PUBLICATIONS

Thixomolding Overview, Introduction to Injection Molding Magnesium, SynergyNet, retrieved on Aug. 20, 2018 (36 pages total) available at http://www.thimag.polimi.it/Dowload/Download%20SynergyNet/Thixomolding%20Overview%20-%20SynergyNet.pdf.

*Primary Examiner* — Sherman Ng
(74) *Attorney, Agent, or Firm* — Dickinson Wright PLLC

(57) ABSTRACT

An enclosure for holding a printed circuit board includes a housing portion of metal containing at least about 90% magnesium and formed by a semi-solid metal casting process of thixomolding, and including a wall defining an opening to form a spring arm including a tabular portion and a contact pad. The spring arm may be deflected from the wall to provide a contact pressure biasing the first contact pad in physical and electrical contact with the printed circuit board and to provide an electrical grounding connection therebetween. Alternative embodiments are also provided with the spring arm transverse to the wall and with a two spring arms on opposite sides of the printed circuit board. A method of forming a housing portion of an enclosure for holding a printed circuit board is also provided, and which includes steps of thixomolding magnesium to form the housing portion including a spring arm.

14 Claims, 6 Drawing Sheets

(56) References Cited

U.S. PATENT DOCUMENTS

2014/0218876 A1\* 8/2014 Subat ................... H05K 9/0018
361/752

\* cited by examiner

US 10,194,552 B1

DIE CAST ENCLOSURE WITH INTEGRAL SPRING CONTACT

BACKGROUND

Many different types of metal enclosures exist for holding a printed circuit board (PCB) and which provide a physical and/or electrical contact between the enclosure and the PCB for different purposes such as holding the PCB in position within the enclosure and for providing an electrical grounding connection between the enclosure and a given area of the PCB. For several reasons, including electromagnetic compatibility (EMC), it is frequently necessary to provide multiple different electrical grounding connections between a PCB and a metal enclosure holding the PCB.

Various methods of making enclosures of metal and providing an electrical connection between such enclosures and PCBs exist today. Each method has advantages and drawbacks. Enclosures formed of sheet metal are able to be formed inexpensively and are able to be provided with integral spring portions, such as, for example, by stamping and being portions of a flat wall. However, enclosures of sheet metal include several design limitations inherent in the process of bending and forming a thin metal sheet. Sheet metal enclosures are also generally less effective at dissipating heat than enclosures of cast metal, making them unsuitable for many applications requiring relatively high amounts of energy to be dissipated in the form of heat and without exceeding temperature thresholds. Enclosures of cast metal have historically had their own set of drawbacks including relatively wide tolerances and brittle materials. The wide tolerances in traditional cast metal enclosures required flexible connections to have a correspondingly large range of travel while maintaining the necessary contact pressure between the enclosure and the PCB. The brittle nature of traditional cast metal enclosures prevented the enclosures from being integrally formed with spring portions that were capable of operating over the large range of travel, which necessitated additional components to provide a flexible and electrically conductive connection between the enclosure and a PCB located therein. One such arrangement that includes additional components is shown in FIG. 1, which uses a compressible pad, such as a surface mount technology (SMT) pad from W. L. Gore & Associates, Inc. (Gore® pad) that is soldered to the PCB and which makes electrically conductive connection with a corresponding post that is formed in a wall of the enclosure. Springs of wire or stamped metal are also sometimes soldered to a PCB for this purpose. While functional, components such as Gore® pads or metal springs add cost and complexity to products that use them. Resilient materials such as those used in Gore® pads may also be susceptible to break-down and/or tearing, which may reduce their effectiveness over time. This cost and complexity is exacerbated in devices that require multiple grounding connections. Therefore, there exists a need for an inexpensive and reliable electrical connection between an enclosure of cast metal and a PCB located therein and which does not require additional components.

SUMMARY

An enclosure for holding a printed circuit board includes a housing portion of metal containing magnesium and formed by a semi-solid metal casting process. The housing portion may include a wall defining an opening to form a first spring arm including a tabular portion integrally formed with a first contact pad. The first spring arm may be elastically deformable and configured to be deflected by the printed circuit board to provide a contact pressure biasing the first contact pad in physical and electrical contact with the printed circuit board. One embodiment is provided in which the tabular portion is generally coplanar with the wall. An alternative embodiment is also provided in which the tabular portion extends generally transversely to the wall.

A method of forming a housing portion of an enclosure for holding a printed circuit board is also provided which comprises the steps of: providing chips containing magnesium into a heated barrel; heating the chips to a temperature between a solidus temperature and a liquidus temperature to create a semi-solid slurry; forming the semi-solid slurry into a rough casting; trimming the rough casting to remove excess material therefrom to produce the housing portion. According to an aspect, the step of trimming the rough casting may include cutting material from a wall of the rough casting to define a first spring arm, which may be elastically deformable for providing a biasing force between the housing portion and the printed circuit board.

Enclosures including one or more spring arms of the present invention may provide several advantages over existing contact means in common use today. They may provide both cost reductions and improved reliability over time.

BRIEF DESCRIPTION OF THE DRAWINGS

The detailed description refers to the following drawings, in which like numerals refer to like items, and in which.

DETAILED DESCRIPTION

Figure 1:
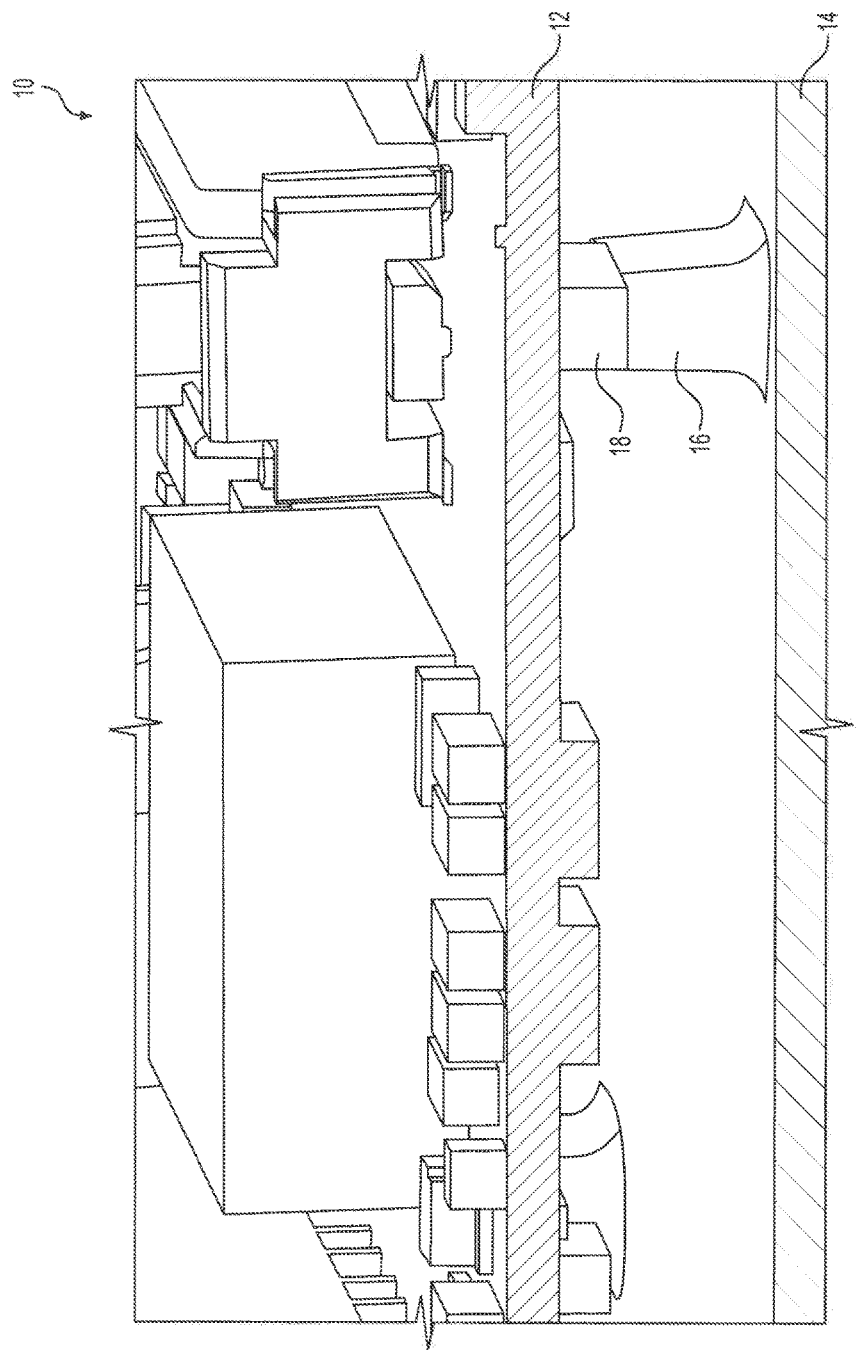
FIG. 1 is a side cut-away view of an enclosure holding a printed circuit board of the prior art.

The invention is described more fully hereinafter with references to the accompanying drawings, in which exemplary embodiments of the invention are shown. This invention may, however, be embodied in many different forms and should not be construed as limited to the embodiments set forth herein. Rather, these exemplary embodiments are provided so that this disclosure is thorough, and will fully convey the scope of the invention to those skilled in the art. It will be understood that for the purposes of this disclosure, "at least one of each" will be interpreted to mean any combination the enumerated elements following the respective language, including combination of multiples of the enumerated elements. For example, "at least one of X, Y, and Z" will be construed to mean X only, Y only, Z only, or any combination of two or more items X, Y, and Z (e.g., XYZ, XZ, YZ, X). Throughout the drawings and the detailed description, unless otherwise described, the same drawing reference numerals are understood to refer to the same elements, features, and structures. The relative size and depiction of these elements may be exaggerated for clarity, illustration, and convenience. Unless otherwise stated, any reference to moving between two or more different positions should be construed as including moving in either direction from one position to another position or vice-versa.

A design for an enclosure 10 according to the prior art is shown in FIG. 1, which includes a printed circuit board 12 electrically and mechanically connected to a housing portion 14 of metal that includes a post 16. The prior art enclosure design 10 also includes a Gore® pad 18 of compressible material with an electrically conductive covering attached to the printed circuit board 12 for making mechanical and electrical contact with the post 16 of the enclosure 10.

Figure 2:
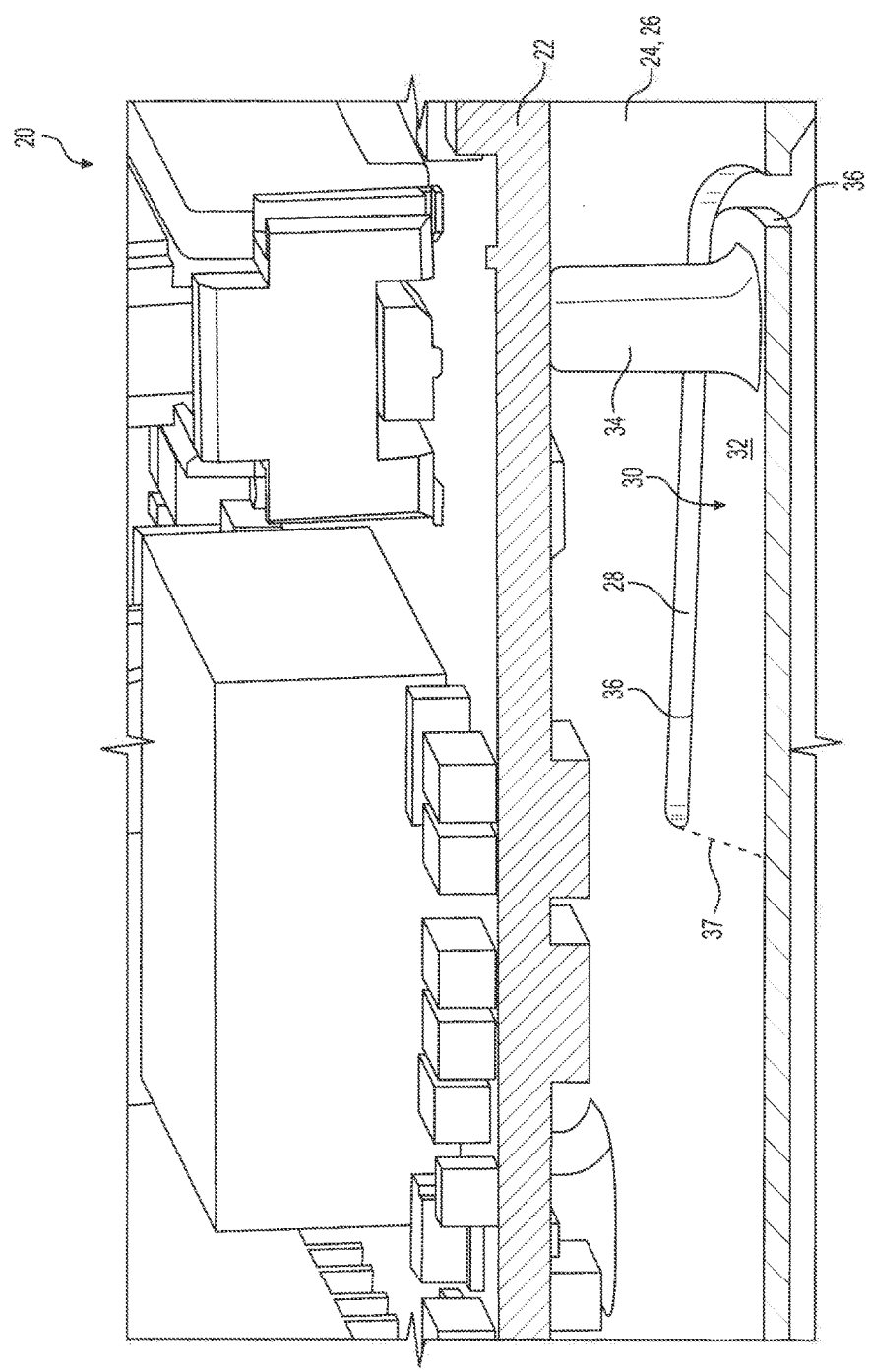
FIG. 2 is a side cut-away view of an enclosure holding a printed circuit board according an example implementation of the present invention.
Figure 3:
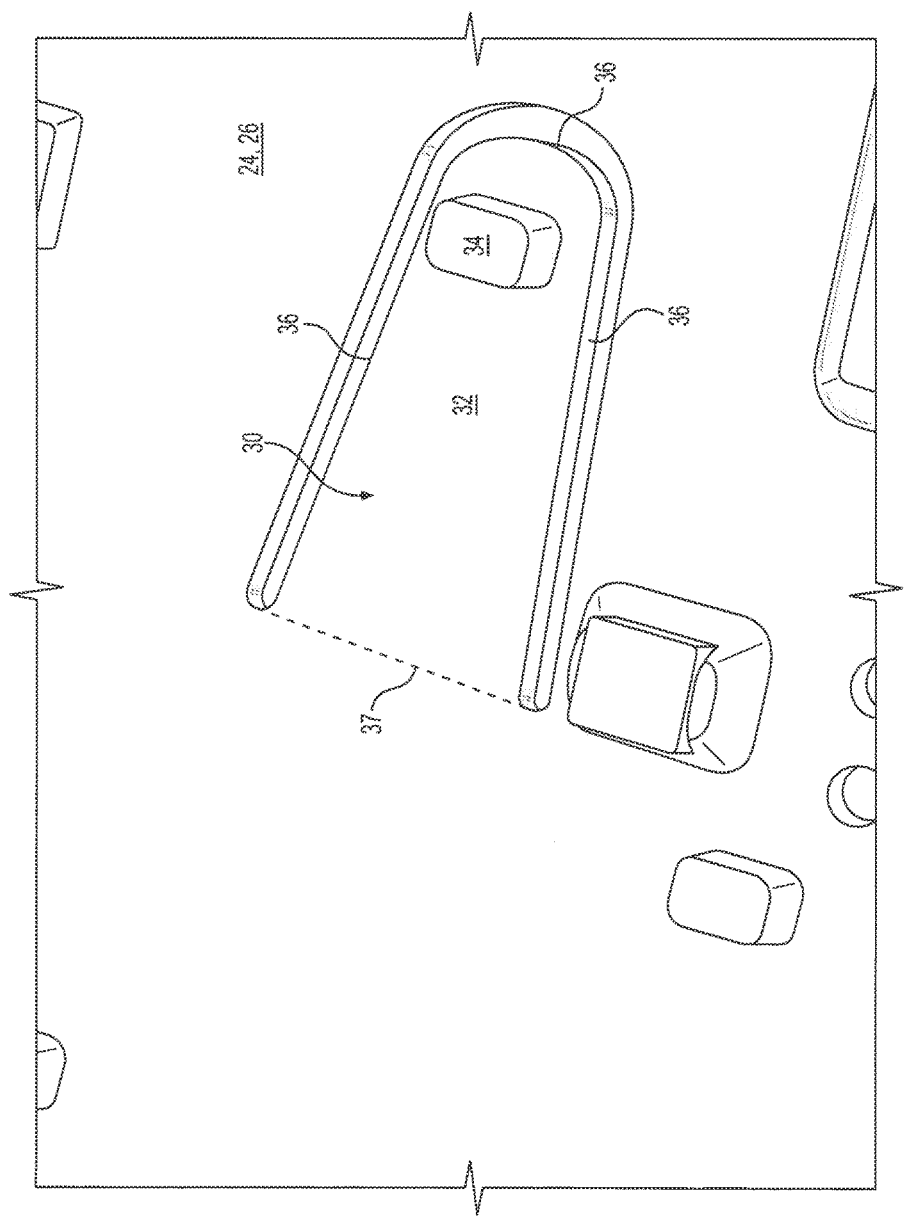
FIG. 3 is a perspective view of a section of the enclosure of FIG. 2 according the example implementation.
Figure 4:
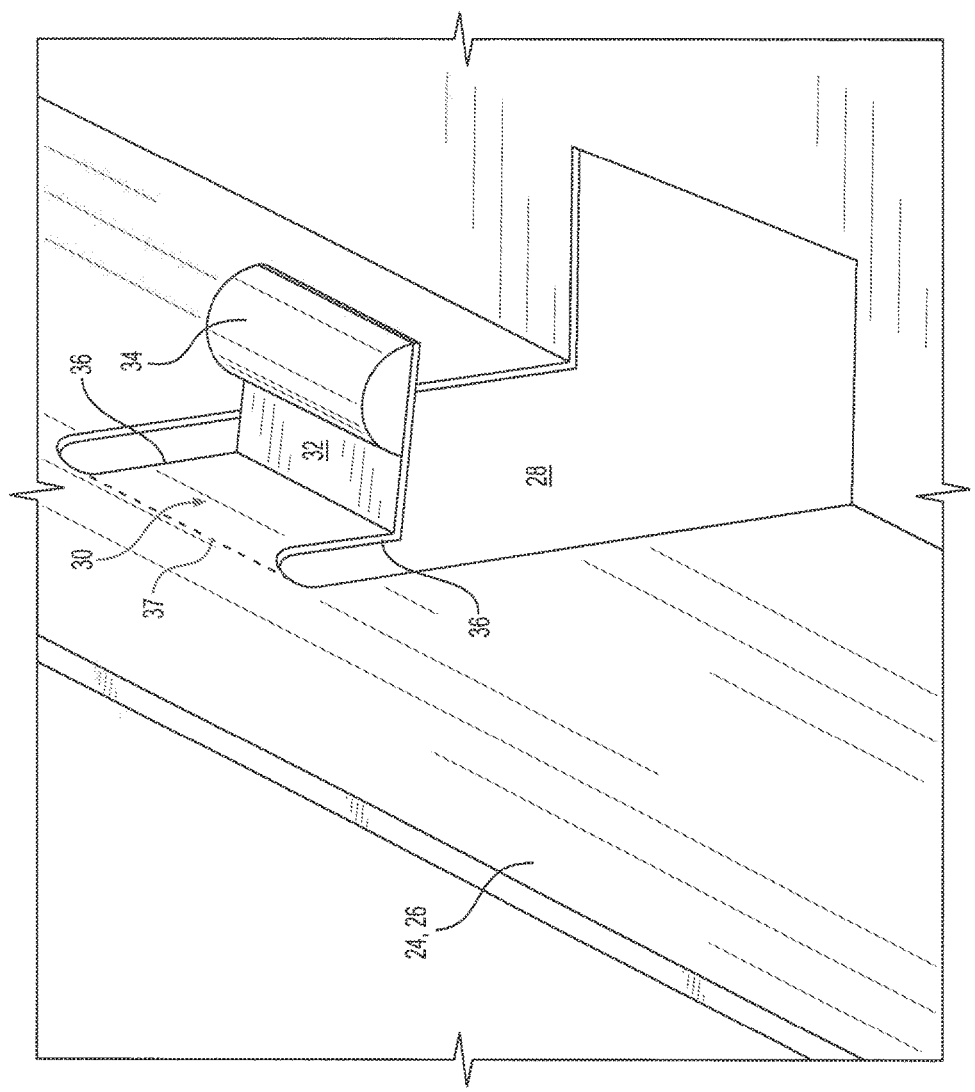
FIG. 4 is a perspective view of a section of an enclosure according to an alternative embodiment.

Referring to the Figures, wherein like numerals indicate corresponding parts throughout the several views, an enclosure 20 for holding a printed circuit board 22 is disclosed. As best shown in FIGS. 2-3, the enclosure 20 comprises a housing portion 24 of metal containing magnesium and formed by a semi-solid metal casting process of thixomolding. The metal containing magnesium may be any alloy of magnesium suitable for the thixomolding processes. According to an aspect, the metal containing magnesium may include at least about 90% magnesium. As shown in FIGS. 2-3, the enclosure 20 may include a wall 26 having a generally planar shape and defining an opening 28 to form a first spring arm 30 having a peripheral edge 36 thereabout. According to an aspect, the opening 28 may have a U-shape, which may be elongated and/or tapering inwardly as best shown in FIG. 3. It should be appreciated that the opening 28 may have other shapes including for example, a C-shape, a triangle, a chevron, etc. According to a further aspect, the first spring arm 30 may remain connected to the wall 26 on a connected portion 37 of the peripheral edge 36, leaving the remaining portions of the peripheral edge 36 detached. As shown in FIGS. 2-4, the connected portion may extend in a single, straight line. In other words, the first spring arm 30 may be peninsular to allow the first spring arm 30 to be deflected. The first spring arm 30 may include a tabular portion 32 with a first contact pad 34 integrally formed therewith and extending generally perpendicularly to the tabular portion 32 for making a physical and electrical contact with the printed circuit board 22.

According to a further aspect, the first spring arm 30 may be elastically deformable and configured to be deflected by the circuit board to provide a contact pressure to bias the first contact pad 34 in physical and electrical contact with the printed circuit board 22 and to provide an electrical grounding connection therebetween. Such elastic deformity is a product of a combination of characteristics of the metal containing magnesium and mechanical attributes of the first spring arm 30. As shown in FIGS. 2-3, the first contact pad 34 may be spaced apart from the connected portion 37 where the first spring arm 30 is attached to the wall 26 so the first contact pad 34 undergoes the maximum deflection as the first spring arm 30 is deflected or bent. The metal containing magnesium may provide the first spring arm 30 with an internal strain that remains below a critical value for creep as the first spring arm 30 is deflected by the circuit board, thereby allowing it to elastically deform and to provide the biasing force resulting in the contact pressure between the housing portion 24 and the printed circuit board 22. Such elastic deformation is not possible with other materials used for die casting metal enclosures of the prior art, which are generally more brittle, and therefore susceptible to breakage. Furthermore, the thixomolding process may allow an enclosure 20 to be manufactured with significantly lower mechanical tolerance values as opposed to die-cast enclosures of the prior art, thereby reducing the amount of deflection required in order to accommodate the variances in the enclosures 20 produced. Thixomolded magnesium enclosures may have tolerances values that are ½ to ⅓ the tolerances of similar die cast aluminum enclosures.

Figure 5:
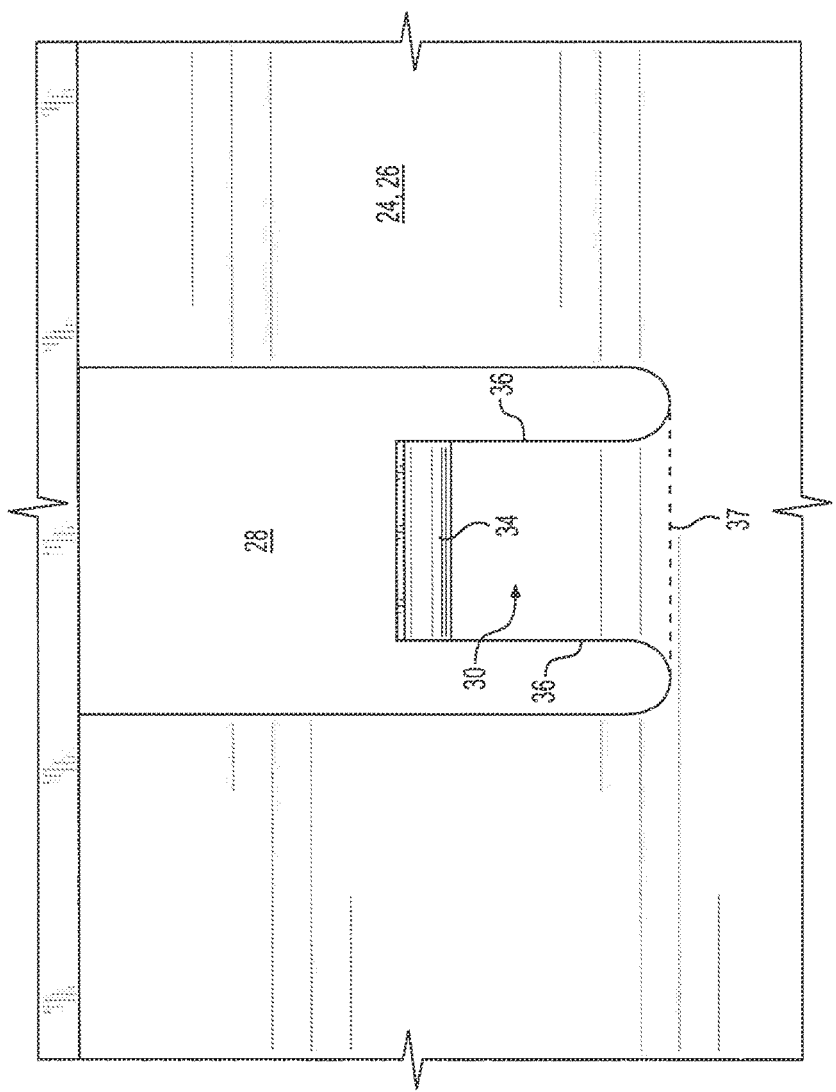
FIG. 5 is a side view of the section of the enclosure of FIG. 4.

As shown in FIGS. 4-5, an alternative embodiment is provided in which the tabular portion 32 extends generally transversely to the wall 26. FIG. 4 also shows the opening 28 extending into other elements of the housing portion 24, besides the wall 26, which may be necessary to simplify the trimming operation and to avoid costly machining operations such as undercuts. The first spring arm 30 also includes a first contact pad 34 first spring arm 30 having a rounded shape, which is different from the rounded-rectangular or elongated post of the first contact pad 34 shown in FIGS. 2-3. It should be appreciated that the contact pads 34 may be formed in any shape that is sufficient to provide the required mechanical force and/or electrical contact with the corresponding portion of the printed circuit board 22.

Figure 6:
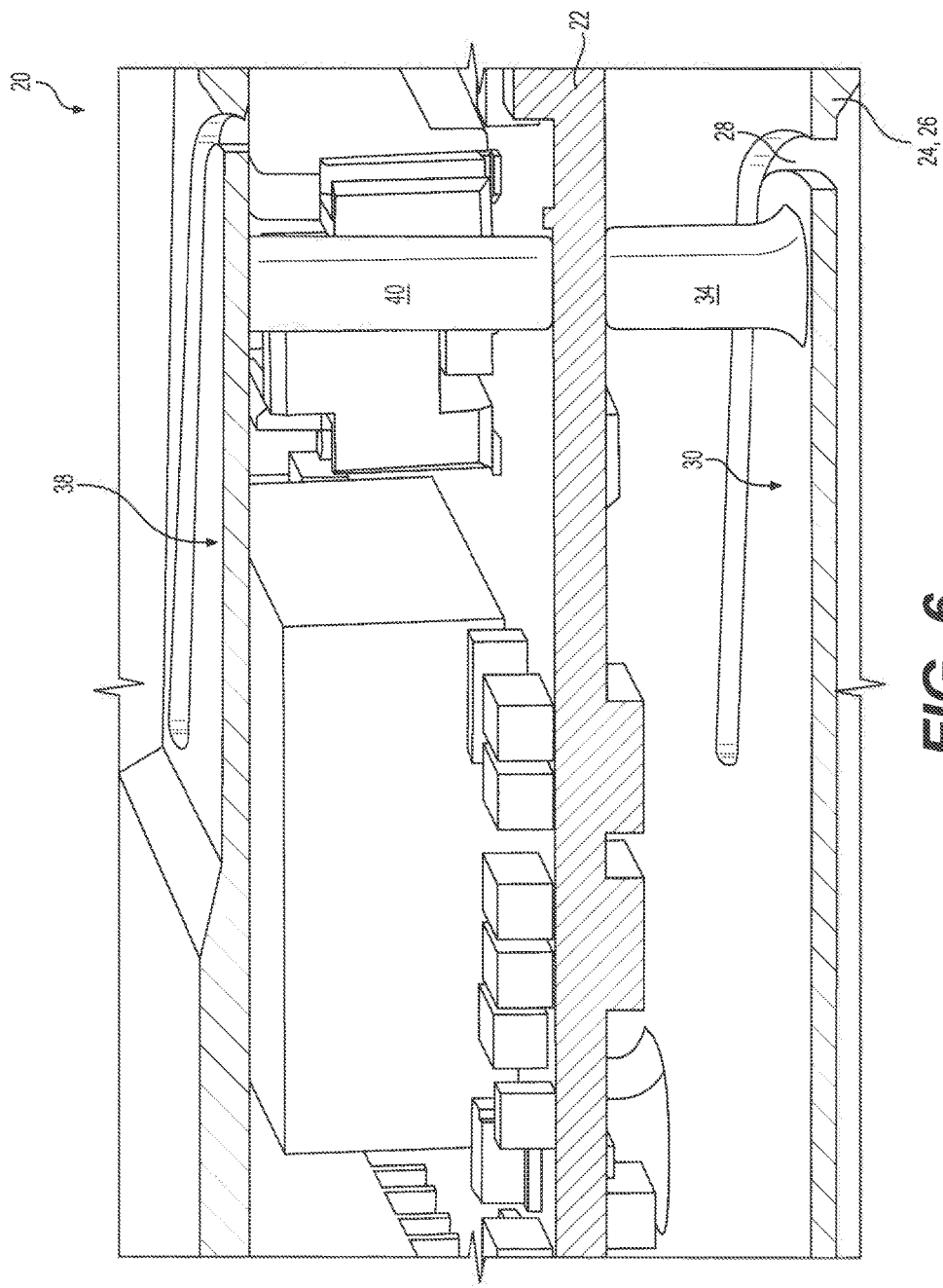
FIG. 6 is a side cut-away view of an enclosure holding a printed circuit board according to another alternative embodiment.

As shown in FIG. 6, another alternative embodiment is provided, which includes a first spring arm 30 as described above, but which also includes a second spring arm 38 including a second contact pad 40 and disposed on an opposite side of the printed circuit board 22 as the first spring arm 30 and which is elastically deformable to be deflected and to provide a biasing force to the printed circuit board 22. According to an aspect, and as shown in FIG. 6, the second contact pad 40 may be disposed directly opposite the first contact pad 34 to sandwich the printed circuit board 22 therebetween. One or more second contact pads 40 may contact the printed circuit board 22 at locations spaced apart from the first contact pad 34 such that the printed circuit board 22 is not directly sandwiched therebetween.

A method of forming a housing portion 24 of an enclosure 20 for holding a printed circuit board 22 is also provided. The method may include steps for thixomolding metal comprising magnesium, which may include a combination of one or more of the following steps: providing chips comprising magnesium by a volumetric feeder into a heated barrel; providing an atmosphere of argon in the heated barrel to prevent oxidation of the chips; heating the chips to a temperature between a solidus temperature and a liquidus temperature to create a semi-solid slurry; feeding the chips by a screw feeder inside the barrel as the chips are heated; generating by the screw feeder a shearing force in the semi-solid slurry to produce a globular structure; injecting the semi-solid slurry into a mold cavity defining the shape of a housing portion 24 of the enclosure 20 to substantially fill the mold cavity before the slurry solidifies; cooling the semi-solid slurry to cause the slurry to solidify into a rough casting retaining the shape of the housing portion 24 of the enclosure 20; and ejecting the rough casting from the mold cavity.

The method of forming the housing portion 24 of an enclosure 20 for holding a printed circuit board 22 may proceed with the steps of: trimming the rough casting to remove excess material therefrom to produce the housing portion 24, including cutting material from a wall 26 portion of the rough casting to define a first spring arm 30 including a first contact pad 34 extending transversely from a tabular portion 32 and being open on three sides leaving only one edge 36 connected to the wall 26 and being elastically deformable for providing a biasing force between the housing portion 24 and the printed circuit board 22, with the printed circuit board 22 held within the enclosure 20.

Obviously, many modifications and variations of the present invention are possible in light of the above teachings and may be practiced otherwise than as specifically described while within the scope of the appended claims.

What is claimed is:

1. An enclosure for holding a printed circuit board and comprising:
   a housing portion of metal containing magnesium and formed by a semi-solid metal casting process and including a wall defining an opening to form a first spring arm;
   said first spring arm including a tabular portion with a first contact pad integrally formed therewith; and
   said first spring arm being elastically deformable to provide a contact pressure biasing said first contact pad in physical and electrical contact with the printed circuit board.

2. The enclosure of claim 1, wherein said semi-solid metal casting process is thixomolding.

3. The enclosure of claim 1, wherein said metal containing magnesium includes at least about 90% magnesium.

4. The enclosure of claim 1, wherein said first contact pad extends generally perpendicularly to said tabular portion of said first spring arm.

5. The enclosure of claim 1, wherein said opening has a U-shape.

6. The enclosure of claim 1, wherein first spring arm includes a peripheral edge and wherein said first spring arm is connected to said wall on only a connected portion of said peripheral edge.

7. The enclosure of claim 1, wherein said tabular portion is generally coplanar with said wall.

8. The enclosure of claim 1, wherein said tabular portion extends generally transversely to said wall.

9. The enclosure of claim 1, wherein said enclosure further includes a second spring arm disposed on an opposite side of the printed circuit board as said first spring arm;
   said second spring arm including a second contact pad; and
   said second spring arm being elastically deformable to provide a biasing force to the printed circuit board.

10. The enclosure of claim 9 wherein said second contact pad is disposed directly opposite said first contact pad to sandwich the printed circuit board therebetween.

11. An enclosure for holding a printed circuit board and comprising:
    a housing portion of metal containing magnesium and formed by a semi-solid metal casting process of thixomolding and including a wall having a generally planar shape and defining an opening having a U-shape to form a first spring arm having a peripheral edge thereabout and including a connected portion of said peripheral edge connected to said wall and said first spring arm having a tabular portion with a first contact pad integrally formed therewith and extending generally perpendicularly to said tabular portion of said first spring arm and with said first spring arm being elastically deformable and configured to be deflected by the circuit board to provide a contact pressure to bias said first contact pad in physical and electrical contact with the printed circuit board and to provide an electrical grounding connection therebetween; and
    wherein said first spring arm has internal strain that each remains below a critical value for creep as said first spring arm is deflected by the circuit board.

12. A method of forming a housing portion of an enclosure for holding a printed circuit board comprising the steps of:
    providing chips comprising magnesium into a heated barrel;
    heating the chips to a temperature between a solidus temperature and a liquidus temperature to create a semi-solid slurry;
    forming the semi-solid slurry into a rough casting;
    trimming the rough casting to remove excess material therefrom to produce the housing portion; and
    wherein the step of trimming the rough casting includes cutting material from a wall portion of the rough casting to define a first spring arm being elastically deformable for providing a biasing force between the housing portion and the printed circuit board.

13. The method of forming a housing portion of an enclosure for holding a printed circuit board of claim 12 further including the steps of:
    feeding the chips by a screw feeder inside the barrel as the chips are heated; and
    generating by the screw feeder a shearing force in the semi-solid slurry to produce a globular structure.

14. The method of forming a housing portion of an enclosure for holding a printed circuit board of claim 12 wherein the step of forming the semi-solid slurry into a rough casting further includes:
    injecting the semi-solid slurry into a mold cavity;
    solidifying the semi-solid slurry into a rough casting; and
    ejecting the rough casting from the mold cavity.

* * * * *